United States Patent
Yoon et al.

(10) Patent No.: US 9,653,515 B2
(45) Date of Patent: May 16, 2017

(54) SEMICONDUCTOR LIGHT EMITTING DEVICE AND SEMICONDUCTOR LIGHT EMITTING APPARATUS INCLUDING THE SAME

(71) Applicant: Samsung Electronics Co., Ltd., Suwon-si (KR)

(72) Inventors: Ju Heon Yoon, Hwaseong-si (KR); Myeong Ha Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 132 days.

(21) Appl. No.: 14/454,742

(22) Filed: Aug. 8, 2014

(65) Prior Publication Data
US 2015/0162376 A1 Jun. 11, 2015

(30) Foreign Application Priority Data
Dec. 6, 2013 (KR) ........................ 10-2013-0151269

(51) Int. Cl.
*H01L 27/15* (2006.01)
*H01L 33/32* (2010.01)
*H01L 33/38* (2010.01)
*H01L 33/62* (2010.01)

(52) U.S. Cl.
CPC .............. *H01L 27/15* (2013.01); *H01L 33/38* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| | | |
|---|---|---|
| KR | 10-0629593 B1 | 3/2006 |
| KR | 10-1155197 B1 | 8/2006 |

(Continued)

OTHER PUBLICATIONS

Jeong et al., "Improved Electrostatic Discharge Protection in GaN-Based Vertical Light-Emitting Diodes by an Internal Diode." IEEE Photonics Technology Letters, vol. 23, No. 7, April 1, 2011.

*Primary Examiner* — Kimberly Rizkallah
*Assistant Examiner* — Bo Bin Jang
(74) *Attorney, Agent, or Firm* — Muir Patent Law, PLLC

(57) ABSTRACT

A semiconductor light emitting device includes a substrate; a light emitting structure and a Zener diode structure disposed to be spaced apart from each other on the substrate, and including a first semiconductor layer and a second semiconductor layer, respectively; and a common, integrally formed, electrode electrically connected to the first semiconductor layer of the light emitting structure and the second semiconductor layer of the Zener diode structure. At least a portion of the Zener diode formed by the Zener diode structure is disposed below the common electrode.

18 Claims, 21 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,164,105 B2 | 4/2012 | Park |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2006/0113548 A1* | 6/2006 | Chen ............... H01L 33/08 257/79 |
| 2006/0261364 A1* | 11/2006 | Suehiro ............ H01L 33/56 257/100 |
| 2007/0029564 A1 | 2/2007 | Han et al. |
| 2010/0270576 A1* | 10/2010 | Ryo ................ H01L 25/167 257/99 |
| 2012/0161161 A1* | 6/2012 | Schubert ......... H01L 25/0753 257/88 |
| 2013/0020554 A1 | 1/2013 | Yang et al. |

FOREIGN PATENT DOCUMENTS

| | | |
|---|---|---|
| KR | 10-0831712 B1 | 3/2008 |
| KR | 10-0872301 B1 | 11/2008 |
| KR | 10-2013-0041048 A | 4/2013 |

* cited by examiner

SEMICONDUCTOR LIGHT EMITTING DEVICE AND SEMICONDUCTOR LIGHT EMITTING APPARATUS INCLUDING THE SAME

CROSS-REFERENCE TO RELATED APPLICATION

This application claims the benefit of Korean Patent Application No. 10-2013-0151269 filed on Dec. 6, 2013, with the Korean Intellectual Property Office, the disclosure of which is incorporated herein in its entirety by reference.

BACKGROUND

The present disclosure relates to a semiconductor light emitting device and a semiconductor light emitting apparatus including the same.

Light emitting diodes (LEDs) emit light through the recombination of electrons and holes within a P-N junction between semiconductor materials included therein, using electric current flowing therethrough. LEDs are commonly used as light sources in display apparatuses and general illumination devices, and development thereof has been accelerating.

In particular, with the commercialization of cellular phone key pads, turn signal lamps, camera flashes and the like utilizing light emitting diodes (for example, gallium nitride-based semiconductor light emitting devices), recent development and active usage of general illumination devices utilizing light emitting diodes has been significantly increased. Such LEDs are employed in products having relatively large size, high level of power applied thereto, and high level of efficiency, such as backlight units for large displays devices, headlights in vehicles, general illumination devices, and the like.

In order to protect light emitting devices from electrostatic discharge (ESD) during operations of the light emitting devices using light emitting diodes, Zener diodes are often used, and in general, such Zener diodes are mounted together with light emitting diodes in packages. Accordingly, light emitting devices having improved withstand voltage characteristics against ESD, along with significantly reduced loss of light emission areas due to the mounting of Zener diodes, have been in demand.

SUMMARY

Exemplary embodiments may provide a semiconductor light emitting device having improved withstand voltage against reverse ESD and improved brightness.

According to an exemplary embodiment of the present disclosure, a semiconductor light emitting device may include: a substrate; a first structure formed on the substrate and including a first n-type semiconductor layer, a first active layer, and a first p-type semiconductor layer; a second structure formed on the substrate and spaced apart from the first structure and including a second n-type semiconductor layer, a second active layer and a second p-type semiconductor layer; a first n electrode and a first p electrode connected to the first n-type semiconductor layer and the first p-type semiconductor layer, respectively; and a second n electrode and a second p electrode connected to the second n-type semiconductor layer and the second p-type semiconductor layer, respectively, wherein the first n electrode is extended to the second p electrode and the first n electrode and the second p electrode are formed of single continuous material, and the second n electrode is spaced apart from the second active layer by a predetermined distance to encompass the second active layer.

The semiconductor light emitting device may include a light emitting diode region in which the first structure is formed and a Zener diode region in which the second structure is formed.

At least a portion of the second structure may be disposed below at least part of the single continuous material that forms the first n electrode and the second p electrode.

The second active layer may be disposed below at least part of the single continuous material that forms the first n electrode and the second p electrode.

The first p electrode may be electrically connected to the second n electrode.

The semiconductor light emitting device may further comprise a connection electrode electrically connecting the first p electrode and the second n electrode.

The connection electrode may be spaced apart from the first and second structures by an insulating layer and may extend along a lateral surface of the first structure.

The first p electrode may include a pad part and at least one finger part extended from the pad part, and the connection part may be extended from the finger part The second p electrode may include a pad part and at least one finger part extended from the pad part, and the finger part may be spaced apart from at least the second n type semiconductor layer by an insulating layer and may extend to the first n electrode along a lateral surface of the second structure The second n electrode may be spaced apart from the second active layer at a substantially uniform interval to encompass the second active layer The second active layer may have a circular, oval or polygonal cross-section, or a combination thereof, with respect to a plane parallel to an upper surface of the substrate The second n electrode may have a ring shape, a part of which is open, to encompass the second active layer.

The second n electrode may have an open curved shape to encompass the second active layer The second structure may include a protruding portion in a central portion thereof and a step portion adjacent to the protruding portion, the protruding portion including the second n-type semiconductor layer, the second active layer, and the second p-type semiconductor layer all having sides that are coplanar with each other.

The protruding portion may have a circular, oval, polygonal cross-section or a combination thereof, with respect to a plane parallel to an upper surface of the substrate The second n electrode may be disposed on an upper surface of the step portion and cover a portion of an upper surface of the second structure on the step portion The first n-type semiconductor layer and second n-type semiconductor layer may be formed of the same material and have substantially the same maximum thickness, and the first active layer and the second active layer are formed of the same material and have substantially the same maximum thickness, and the first p-type semiconductor layer and the second p-type semiconductor layer may each be formed of the same material and have the same maximum thickness.

The first and second structures may each further include a transparent electrode layer formed on the first p-type semiconductor layer and the second p-type semiconductor layer, respectively.

The first p electrode, and the first n electrode and second p electrode, may each be spaced apart from each end portion of the substrate by a predetermined distance in a longitudinal direction.

The substrate may be exposed in the region in which the first structure and the second structure are spaced apart.

According to an exemplary embodiment, the light emitting device may be located in a package body having a first electrode structure and a second electrode structure.

According to an exemplary embodiment of the present disclosure, a semiconductor light emitting device may include: a substrate; a light emitting structure and a Zener diode structure disposed to be spaced apart from each other on the substrate, and including a first semiconductor layer and a second semiconductor layer, respectively; and a common, integrally formed electrode electrically connected to the first semiconductor layer of the light emitting structure and the second semiconductor layer of the Zener diode structure, which are integrally formed, wherein at least a portion of the Zener diode formed by the Zener diode structure is disposed below the common electrode.

The common electrode may be formed at a first height above a top surface of the Zener diode structure and at a second height that is a mid-height of the first semiconductor layer, the mid-height different from the first height.

The Zener structure may include a step portion region formed of at least a portion of the first semiconductor layer, and a first electrode may be disposed to encompass at least a portion of the mesa-etched region while being spaced apart by a predetermined distance from a protruding region that protrudes from the step portion region.

The protruding region may have a cylindrical shape and the first electrode may have a ring shape to encompass the cylindrical shape protruding region.

According to another aspect of the present disclosure, a semiconductor light emitting apparatus may include: a package body having a first electrode structure and a second electrode structure; and the semiconductor light emitting device, located in the package body.

The first electrode structure may include conductive wires connected to the first n electrode and the second p electrode, and the second electrode structure may include a conductive wire connected to the first p electrode.

In one embodiment, an apparatus includes a semiconductor light emitting device. The semiconductor light emitting device includes a substrate; a light emitting diode structure and a Zener diode structure spaced apart from each other on the substrate, each including a first semiconductor layer at a first vertical level, and a second semiconductor layer at a second vertical level above the first vertical level; and a continuously formed electrode electrically connected to the first semiconductor layer of the light emitting diode structure and the second semiconductor layer of the Zener diode structure. The continuous electrode may have a first doping type at the first semiconductor layer of the light emitting diode structure and a second doping type at the second semiconductor layer of the Zener diode structure, the first doping type opposite the second doping type.

The first doping type may be an n-type, and the second doping type may be a p-type.

At least a portion of the Zener diode structure may be disposed below the continuous electrode, and at least a portion of the light emitting diode structure may be disposed above the continuous electrode.

BRIEF DESCRIPTION OF DRAWINGS

The above and other aspects, features and other advantages will be more clearly understood from the following detailed description taken in conjunction with the accompanying drawings, in which.

DETAILED DESCRIPTION

Figure 1:
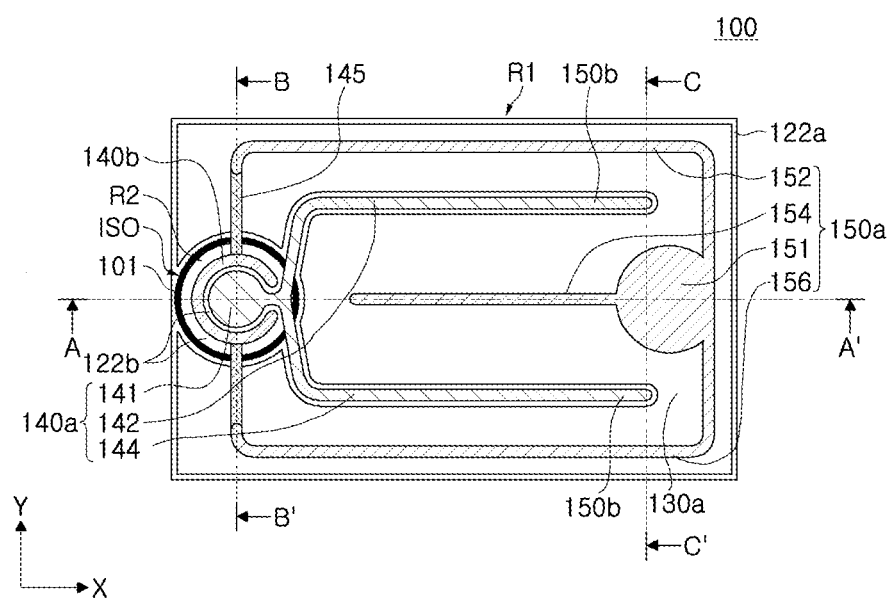
FIG. 1 is a schematic plan view of a semiconductor light emitting device according to an exemplary embodiment of the present disclosure.

Embodiments of the present disclosure will now be described in detail with reference to the accompanying drawings.

The disclosure may, however, be exemplified in many different forms and should not be construed as being limited to the specific embodiments set forth herein.

In the drawings, the shapes and dimensions of elements may be exaggerated for clarity, and the same reference numerals will be used throughout to designate the same or like elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
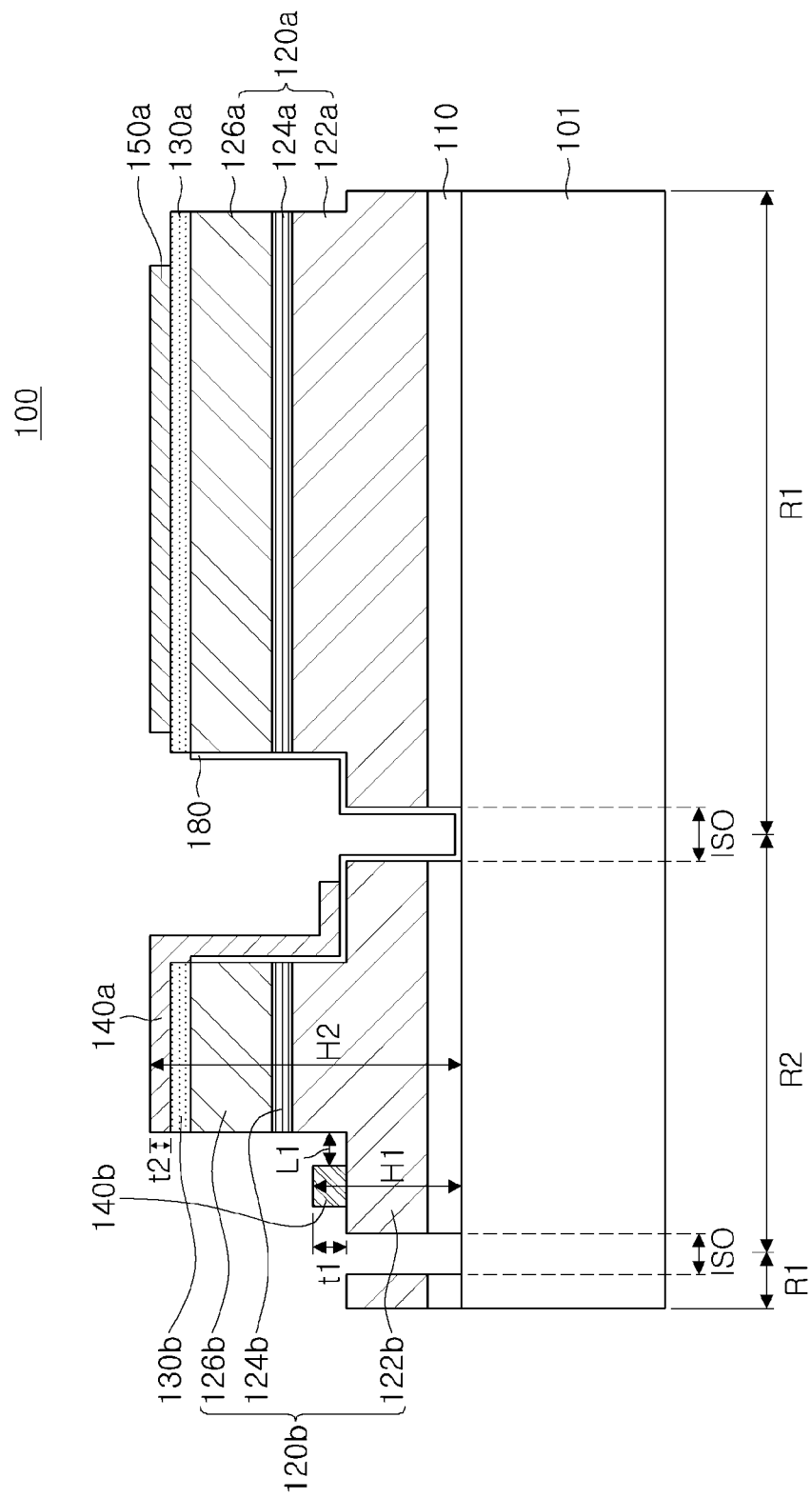
FIG. 2 is a schematic lateral cross-sectional view of a semiconductor light emitting device taken along line A-A' of FIG. 1, according to an exemplary embodiment of the present disclosure.
Figure 3:
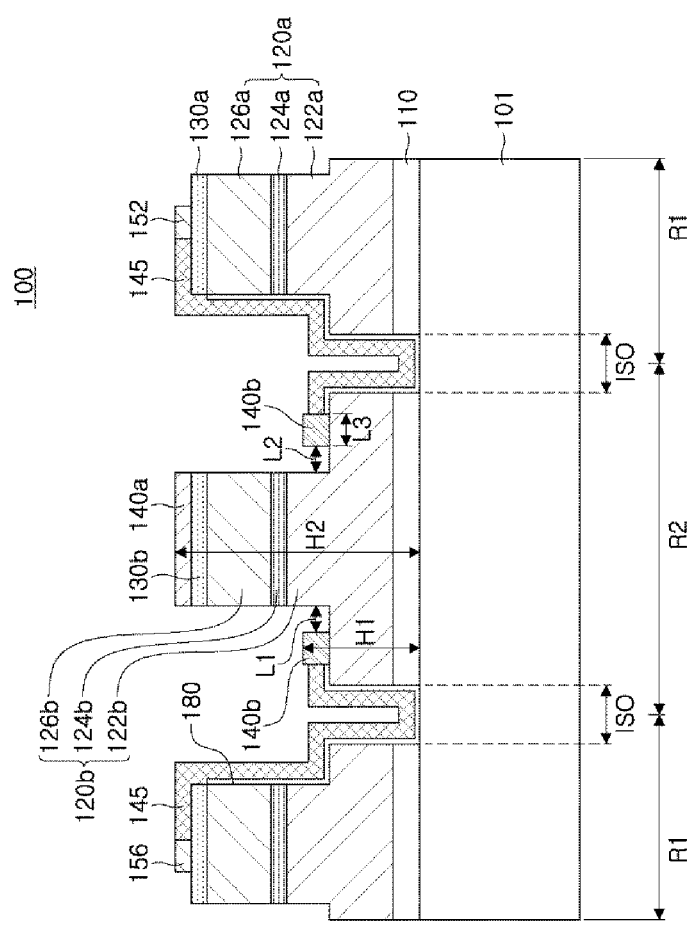
FIG. 3 is a schematic lateral cross-sectional view of a semiconductor light emitting device taken along line B-B' of FIG. 1, according to an exemplary embodiment of the present disclosure.
Figure 4:
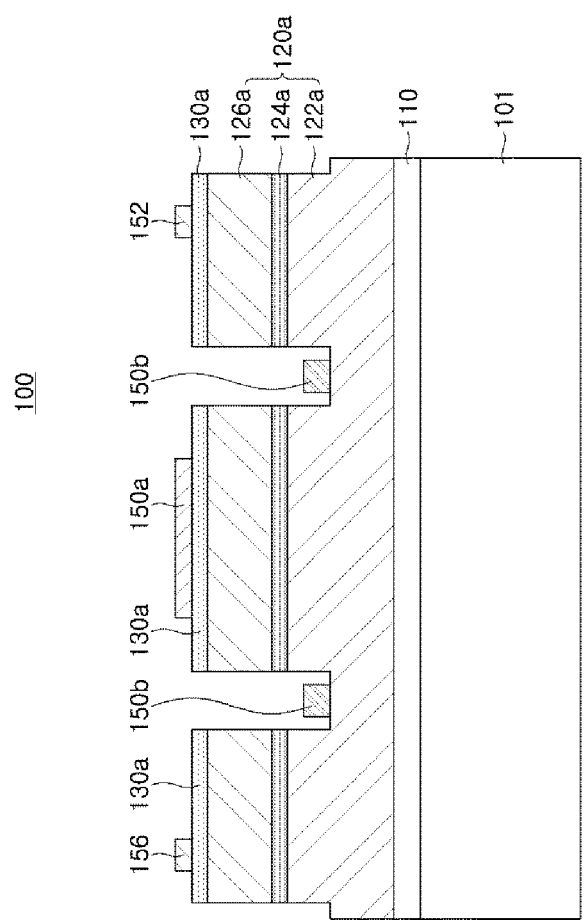
FIG. 4 is a schematic lateral cross-sectional view of a semiconductor light emitting device taken along line C-C' of FIG. 1, according to an exemplary embodiment of the present disclosure.

FIG. 1 is a schematic plan view of a semiconductor light emitting device according to an embodiment of the present disclosure. FIG. 2 is a schematic lateral cross-sectional view of a semiconductor light emitting device taken along line A-A' of FIG. 1, FIG. 3 is a schematic lateral cross-sectional view of a semiconductor light emitting device taken along line B-B' of FIG. 1, and FIG. 4 is a schematic lateral cross-sectional view of a semiconductor light emitting device taken along line C-C' of FIG. 1.

With reference to FIG. 1, a semiconductor light emitting device 100 includes a light emitting diode ("LED") region R1, a Zener diode region R2, and a device isolation region ISO formed therebetween. The semiconductor light emitting device 100 may have a monolithic structure in which the Zener diode region R2 is integrated with the semiconductor light emitting device 100, such that the degree of integration of a device such as a package or a light emitting device may be increased and brightness thereof may be secured.

With reference to FIGS. 1 to 4, the semiconductor light emitting device 100 may include a first structure 120a disposed in the light emitting diode region R1 and a second structure 120b disposed in the Zener diode region R2. The first structure 120a may be electrically isolated from the second structure 120b through the device isolation region ISO.

The first and second structures 120a and 120b may include first and second n-type semiconductor layers 122a and 122b, first and second active layers 124a and 124b, and first and second p-type semiconductor layers 126a and 126b, respectively. In addition, the semiconductor light emitting device 100 may include a first p electrode 150a (also referred to generally as an LED electrode) formed on the first structure 120a, and a second n electrode 140b and a second p electrode 140a formed on the second structure 120b (each also referred to generally as a Zener diode electrode), as an electrode structure. Transparent electrode layers 130a and 130b may be further formed on upper surfaces of the first and second p-type semiconductor layers 126a and 126b, respectively.

The terms "on", "upper part", "upper surface", "below", "lower part", "lower surface", "side surface", and the like, as used in the present disclosure, are used in connection with the drawings, and may be used differently depending on a direction in which a device is disposed.

A substrate 101 may have an upper surface extended in x and y directions. For example, the substrate 101 may be a semiconductor growth substrate and may be formed using an insulating, conductive semiconductor material such as sapphire, silicon carbide (SiC), $MgAl_2O_4$, MgO, $LiAlO_2$, $LiGaO_2$, GaN, or the like. In the case of a sapphire substrate, widely used as a nitride semiconductor growth substrate, sapphire is a crystal having Hexa-Rhombo R3c symmetry while having electrical insulation, lattice constant of 13.001 Å in c-axis direction and 4.758 Å in a-axis direction, and a C (0001) plane, an A (11-20) plane, an R (1-102) plane, and the like. In this case, since the C plane relatively facilitates the growth of a nitride thin film and is stable at relatively high temperatures, the sapphire may be mainly used as a growth substrate for a nitride semiconductor. On the other hand, although not shown in the drawings, an upper surface of the substrate 101, for example, a growth surface for semiconductor layers, may include a plurality of concave-convex portions formed therein, and crystalline properties of the semiconductor layers, light emission efficiency thereof, and the like, may be improved by such a concave-convex structure.

A buffer layer 110 may be formed to reduce occurrence of lattice defects in the first and second structures 120a and 120b grown on the substrate 101, and may be formed, for example, of an undoped semiconductor layer formed of nitride or the like. For example, the buffer layer 110 may reduce a lattice constant difference between the substrate 101 formed for example of sapphire and the first and second n-type semiconductor layers 122a and 122b stacked on the substrate 101 and formed for example of GaN, such that crystalline properties of a GaN layer may be increased. The buffer layer 110 may include an undoped GaN layer, an undoped AlN layer, an undoped InGaN layer, or the like, applied thereto, and in one embodiment, may be grown to have a thickness of tens to hundreds of Å at a relatively low temperature of 500° C. to 600° C. Here, "undoped" may refer to a process in which a semiconductor layer is not separately subjected to an impurity doping process, but may also refer to an impurity concentration level originally contained in a semiconductor layer as it is, for example, when a nitride gallium semiconductor is grown using a metal organic chemical vapor deposition (MOCVD) method, Si or the like used as a dopant may be contained therein at a level of about $10^{14}$ to $10^{18}/cm^3$, even if unintentionally.

The first and second structures 120a and 120b may form a light emitting diode and a Zener diode, respectively. The second structure 120b may be disposed at a portion of the substrate 101, and, as shown in FIG. 1, may be spaced apart from each end portion of the substrate 101 by a predetermined distance in a longitudinal direction (e.g., x direction). However, the second structure 120b may be variously disposed according to certain embodiments without being particularly limited. According to an embodiment, in a region of the semiconductor light emitting device not adjacent to the first structure 120a, for example, to the left of the second structure 120b of FIG. 2, the device isolation region ISO may extend to an edge of the semiconductor light emitting device 100.

The second structure 120b may include a mesa-etched region in a central portion thereof including a portion of the second n-type semiconductor layer 122b, the second active layer 124b and the second p-type semiconductor layer 126b, and an etched region formed by etching a portion of the second n-type semiconductor layer 122b, in the vicinity of the mesa-etched region. Thus, the second structure 120b may include a protruding region, and a base region, wherein the base region has a top surface a certain height from the top surface of the substrate, and the protruding region has a top surface a different, greater height from the top surface of the substrate. The base region may correspond to the second n-type semiconductor layer 122b where it has a first height, and the protruding region may correspond to the second n-type semiconductor layer 122b where it has a second height greater than the first height. The first height portion may also be referred to as a step portion, and the second height portion may be referred to as a protruding portion.

The first structure 120a may also have a base region and a protruding region.

In one embodiment, the mesa-etched region may have a cylindrical shape, and the second active layer 124b may have a circular cross-section on a plane parallel to an upper surface of the substrate 101, for example, on an x-y plane. In the present disclosure, the term "circular" may be used to refer to a shape of optional closed lines, configured of curved lines without a vertex, as well as a curved line formed by dots having a predetermined distance from one point on a plane, and the term "cylindrical shape" may also be used to refer to a column having a circular cross-section. However, a cross-section of the second active layer 124b according to certain embodiment is not limited to a circular shape, and according to a further embodiment, the second active layer 124b may have a cross-section including curved line and straight line regions.

The first and second structures 120a and 120b may include first and second n-type semiconductor layers 122a and 122b, first and second active layers 124a and 124b, and first and second p-type semiconductor layers 126a and 126b sequentially formed on the substrate 101, respectively. The first n-type semiconductor layer 122a, the first active layer 124a, and the first p-type semiconductor layer 126a of the first structure 120a, and the second n-type semiconductor layer 122b, the second active layer 124b and the second p-type semiconductor layer 126b of the second structure 120b may each be formed of the same respective material, and may each have the same respective thicknesses corresponding to the portions formed of the same materials.

The first and second n-type semiconductor layers 122a and 122b may be formed of a semiconductor doped with an n-type impurity, and the first and second p-type semiconductor layers 126a and 126b may be formed of a semiconductor doped with a p-type impurity. However, according to one embodiment, the positions of the first and second n-type semiconductor layers 122a and 122b and the first and second p-type semiconductor layers 126a and 126b may be changed such that they are disposed in positions opposite to each other. In certain embodiments, the first and second n-type semiconductor layers 122a and 122b and the first and second p-type semiconductor layers 126a and 126b may be formed of a nitride semiconductor including a material having a composition of, for example, $Al_xIn_yGa_{1-x-y}N$ ($0 \leq x \leq 1$, $0 \leq y \leq 1$, and $0 \leq x+y \leq 1$). The first and second n-type semiconductor layers 122a and 122b and the first and second p-type semiconductor layers 126a and 126b may alternatively be formed using, for example, a material of an AlGaInP-based semiconductor or an AlGaAs-based semiconductor.

The first and second active layers 124a and 124b may be p-n junctions, also referred to herein as p-n junction portions, interposed between the first and second n-type semiconductor layers 122a and 122b and the first and second p-type semiconductor layers 126a and 126b, respectively, and may emit light having a predetermined amount of energy through recombination of electrons and holes. For example, the first and second active layers 124a and 124b may contain a material having an energy band gap smaller than that of the first and second n-type semiconductor layers 122a and 122b and the first and second p-type semiconductor layers 126a and 126b. For example, when the first and second n-type semiconductor layers 122a and 122b and the first and second p-type semiconductor layers 126a and 126b are GaN-based compound semiconductors, the first and second active layers 124a and 124b may include an InAlGaN-based compound semiconductor having an energy band gap smaller than that of GaN. In addition, the first and second active layers 124a and 124b may have a multiple quantum well (MQW) structure, for example, an InGaN/GaN structure, in which a quantum well layer and a quantum barrier layer are alternately stacked.

The first and second n electrodes 150b and 140b may be electrically connected to the first and second n-type semiconductor layers 122a and 122b, respectively (e.g., the first n electrode 150b may contact the first n-type semiconductor layer 122a, and the second n electrode 140b may contact the second n-type semiconductor layer 122b), and the first and second p electrodes 150a and 140a may be electrically connected to the first and second p-type semiconductor layers 126a and 126b, respectively (e.g., through a transparent electrode layer 130a). The first n electrode 150b may be integrally formed with the second p electrode 140a. For example, in one embodiment, the first n electrode 150b is formed of a common electrode integrally formed with the second p electrode 140a. In addition, the first n electrode 150b and the second p electrode 140a may be separately formed and electrically connected afterwards, but in the embodiment of the FIGS. 1-4, a case in which the first n electrode 150b and the second p electrode 140a are formed as a common electrode is provided as an example. The common electrode may include a first portion at a first vertical height (e.g., the second p electrode 140a portion), and a second portion at a second, different vertical height (e.g., the first n electrode 150b portion).

The first and the second p electrodes 150a and 140a may be disposed on the upper surface of the first and second structures 120a and 120b, respectively, while being spaced apart from each end portion of the substrate 101 by a predetermined distance in a longitudinal direction (e.g., x direction).

As shown in FIG. 4, in the first structure 120a, the first n electrode 150b may be formed on the first n-type semiconductor layer 122a on a step portion region of the first structure 120a (e.g., on a mid-height portion of the first n-type semiconductor layer 122a, the mid-height being neither the top height nor the bottom height of the first n-type semiconductor layer 122a), the first p electrode 150a may be formed on the first p-type semiconductor layer 126a, and the transparent electrode layer 130a may be interposed between the first p electrode 150a and the first p-type semiconductor layer 126a. In addition, although not shown in the drawings, a separate current blocking layer may be further formed in a region corresponding to the first p electrode 150a below the first p electrode 150a and the transparent electrode layer 130a, such that an electric signal applied from the first p electrode 150a, for example, a current, may easily be dispersed uniformly in the first structure 120a through the transparent electrode layer 130a without being limited to a lower part of the first p electrode 150a. The current blocking layer may be formed of a transparent insulating material such as silicon oxide, silicon nitride, or the like.

As shown in FIG. 1, the second p electrode 140a may include a pad portion 141 and a plurality of finger portions 142 and 144 extending in a particular direction, for example, in an x direction, from the pad portion 141 in a manner in which widths thereof are smaller than those of the pad portion 141, such that current is uniformly injected thereinto. The plurality of finger portions 142 and 144 may include a connecting portion between the pad portion 141 and straight portions that extend in the particular direction (e.g., the x direction). The connecting portion may extend in a different direction from the x direction.

The plurality of finger portions 142 and 144 may be disposed on the first n-type semiconductor 122a in the step portion region of the first structure 120a (e.g., on a mid-height portion of the first structure 120a). In addition, the first p electrode 150a may also include a pad portion 151 and a plurality of finger portions 152, 154, and 156. In order to increase light emission efficiency in the first structure 120a, the finger portions 142 and 144 of the second p electrode 140a and the finger portions 152, 154 and 156 of the first p electrode 150a may be alternately disposed. However, the shape and structure of the second n electrode 150b and the first p electrode 150a are provided by way of example and are not limited to those shown in the drawings.

The first n electrode 150b may be formed to have a similar shape to that of the plurality of finger portions 142 and 144, that is, an elongated shape having a small width and extended in a particular direction (such as the x direction), to be integrally formed with the plurality of finger portions 142 and 144. However, the shape and structure of the first n electrode 150b is an example and is not limited thereto.

As shown in FIGS. 1 to 3, the second n electrode 140b may be formed on the second n-type semiconductor layer 122b in the base region of the second structure 120b, and the second p electrode 140a may be formed to be extended from the upper surface of the second p-type semiconductor layer 126b of the second structure 120a to the upper surface of the first n-type semiconductor layer 122a of the first structure 120a and may be integrally formed with the first n electrode 150b. Thus the second p electrode 140a and first n electrode 150b may form a continuous electrode that extends from top surface of a protruding region of the second structure 120b to a top surface of a base region (e.g., a top surface at a step portion) of the first structure 120a. As such, at least a first portion of a light emitting diode structure may be disposed below the continuous electrode, and at least a second portion of a light emitting diode structure may be disposed above the continuous electrode.

The second n electrode 140b may be spaced apart from the second active layer 124b by a predetermined distance to encompass the second active layer 124b. The second n electrode 140b may be disposed to be spaced apart from the mesa-etched region by a predetermined distance L1 or L2 to have a ring-shaped cross section, and a width L3 thereof may be variously changed according to different embodiments. In addition, in one embodiment, the second n electrode 140b has a ring-shaped cross section, a "C" shape, a part of which is open with respect to a plane parallel to an upper surface of the substrate 101, such as, xy plane. However, the shape of the cross section of the second n electrode 140b of the present disclosure is not limited to the case in which the outline is formed of a curve, and may have a shape in which the outline includes, for example, regions of a curve and a straight line.

An upper surface of the second n electrode 140b may be positioned at a first height H1 from an upper surface of the substrate 101, and an upper surface of the second p electrode 140a may be positioned at a second height H2, higher than the first height H1 from the upper surface of the substrate 101. However, according to another embodiment, the second n electrode 140b may be disposed such that the first height H1 and the second height H2 are the same. In addition, a first thickness T1 of the second n electrode 140b may be similar to or equal to a second thickness T2 of the second p electrode 140a, but may be changed depending on a width of the second p electrode 140a, a size of the second structure 120b, or the like; for example, the first thickness T1 may be greater than the second thickness T2.

The transparent electrode layers 130a and 130b may be formed of a transparent conductive oxide layer having relatively excellent ohmic contact performance while having relatively high light transmissivity, and may be formed of at least one selected, for example, from a group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide (ZnMgO).

The first and second n electrodes 150b and 140b and the first and second p electrodes 150a and 140a may contact a conductive wire, a solder bump, or the like, and may contain, for example, at least one of gold (Au), tungsten (W), platinum (Pt), silicon (Si), iridium (Ir), silver (Ag), copper (Cu), nickel (Ni), titanium (Ti), chromium (Cr), and alloys thereof.

The connection electrode 145 may be extended along a lateral surface of the first structure 120a and the device isolation region ISO to connect the first p electrode 150a of the first structure 120a and the second n electrode 140b of the second structure 120b to each other. In addition, the connection electrode 145 may be formed to extend from the finger portions 152 and 156 of the first p electrode 150a. The connection electrode 145 may be insulated from the first and second structures 120a and 120b by an insulating layer 180. Further, according to an embodiment, a side of the first structure 120a on which the connection electrode 145 is formed may not have a step, but may be formed in a linear or inclined linear manner.

With reference to FIGS. 1 to 4, the Zener diode region R2 may include the second structure 120b, the second n electrode 140b, and the second p electrode 140a, in order to thereby configure a Zener diode. The second structure 120b may have a mesa etching shape (e.g., a step-shape), and may have a cylindrical shape including a portion of the second n-type semiconductor layer 122b, the second active layer 124b, and the second p-type semiconductor layer 126b on the second n-type semiconductor layer 122b.

The transparent electrode layer 130b and the second p electrode 140a may be formed on the second p-type semiconductor layer 126b and may have a circular cross-section. The second n electrode 140b may be formed to be ring shaped to encompass or surround the second active layer 124b on the second n-type semiconductor layer 122b, when viewed from a perspective such as shown in FIG. 1. The second n electrode 140b may be spaced apart from the second active layer 124b by a predetermined distance, when viewed from the perspective shown in FIG. 1, to encompass a structure including portions of the second n-type semiconductor layer 122b, the second active layer 124b, and the second p-type semiconductor layer 126b.

As such, the second n electrode 140b and the second p electrode 140a may be disposed such that charges due to an ESD voltage may be efficiently dispersed, thus preventing the occurrence of a phenomenon in which charges are concentrated at a portion of the second n electrode 140b to deteriorate a performance of a Zener diode. According to simulation results, the Zener diode according to the present embodiment exhibited forward diode characteristics in which the maximum current density was reduced from 72.9 $A/cm^2$ to about 44.7 $A/cm^2$-45.0 $A/cm^2$, as compared to a Zener diode with a general structure having the same area as that of the Zener diode according to the present embodiment, but without a circular electrode. Through such characteristics, it can be seen that the Zener diode according to the present embodiment may significantly reduce the occurrence of a current crowding phenomenon at the time of operation, and it may also be expected that an ESD withstand voltage is able to be increased.

Figure 5:
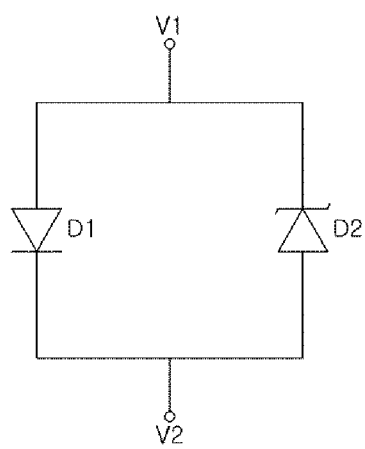
FIG. 5 is an equivalent circuit diagram of a semiconductor light emitting device according to an exemplary embodiment of present disclosure.

FIG. 5 is an equivalent circuit diagram of a semiconductor light emitting device according to an embodiment.

With reference to FIG. 5, a first diode D1, which is a light emitting diode, may be connected to a second diode D2, a Zener diode, in parallel. The second diode D2 may be connected to the first diode D1 through opposing polarities. The first and second diodes D1 and D2 may be disposed in the light emitting diode region R1 and the Zener diode region R2, respectively, with reference to FIGS. 1 to 3, and may be configured of the first and second structures 120a and 120b, respectively.

When a normal forward voltage is applied to two terminals V1 and V2 of the first diode, a majority of current flows through a p-n junction of the first diode D1, such that a forward current for light emission may be formed. However, when a momentarily reversed high voltage, for example, an ESD voltage through a reverse electrostatic discharge (ESD), is applied, the second diode D2 may be turned on. Accordingly, since a majority of current through the ESD voltage may flow through the second diode D2 instead of the first diode D1, the first diode D1 may be prevented from being damaged thereby.

A semiconductor light emitting device 100 having a structure as described above may contain a Zener diode in the region thereof conventionally used for an electrode only, thereby having an advantageous effect in which loss of the light emission space may be reduced.

Illustrating in detail, to protect semiconductor light emitting diodes from the electrostatic discharge (ESD) when semiconductor light emitting diodes are operated, Zener diodes may be separately used and the Zener diodes may be mounted on a package together with a light emitting diode chip. However, as separate Zener diodes are used, the cost increases, and light emitted from the light emitting diodes chip is blocked by a Zener diode, resulting in a problem in which brightness of the semiconductor light emitting diode is diminished. To improve upon this, a Zener diode may be mounted inside a light emitting diode chip; however, if a Zener diode is mounted on a portion of a light emitting diode chip, it results in a problem in which space for emitting light of a light emitting diode chip may be reduced. The semiconductor light emitting diode according to an embodiment of the present disclosure may have an advantageous effect in that loss of space for emitting light may be reduced by disposing Zener diodes in regions conventionally used for electrodes only.

FIGS. 6A to 10B schematically illustrate main processes of a method of manufacturing a semiconductor light emitting device according to one embodiment. In FIGS. 6A to 10B, the same reference numbers as in FIGS. 1 to 4 refer to the same elements, and thus, descriptions of overlapped portions will be omitted.

Figure 6A:
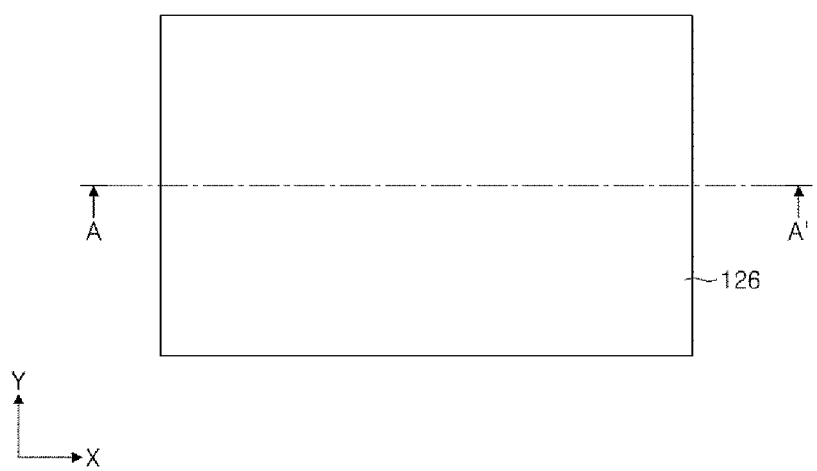
FIGS. 6A to 10B schematically illustrate main processes of a method of manufacturing a semiconductor light emitting device according to an embodiment.
Figure 6B:
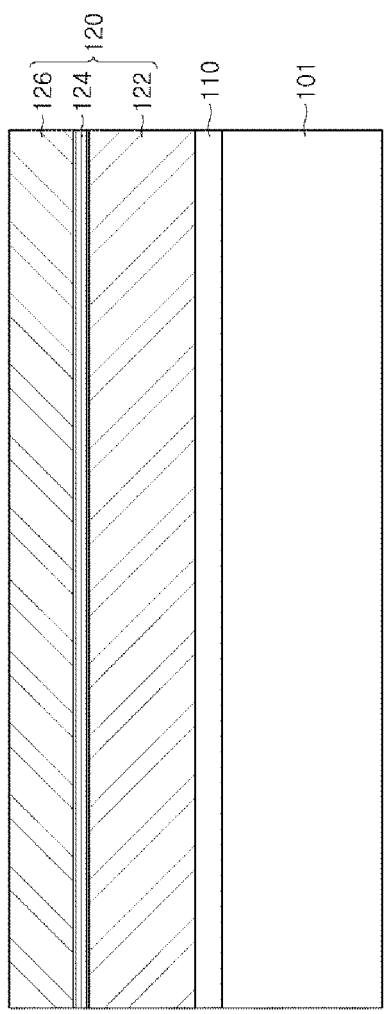

With reference to FIGS. 6A and 6B, FIG. 6A is a plan view of a region corresponding to the region of FIG. 1, and FIG. 6B is a cross-sectional view taken along line B-B' of FIG. 6A. FIGS. 7A to 10B are illustrated in the same manner as above.

First, a buffer layer 110 may be formed on a substrate 101. However, according to an embodiment, the buffer layer 110 may be omitted. As described above, the substrate 101 may be formed using a substrate formed of a material such as sapphire, silicon carbide (SiC), $MgAl_2O_4$, magnesium oxide (MgO), $LiAlO_2$, $LiGaO_2$, gallium nitride (GaN), or the like, and the buffer layer 110 may be formed of a material such as undoped GaN, undoped AlN, undoped InGaN or the like.

Subsequently, a stacked structure 120 may be formed to include an n-type semiconductor layer 122, an active layer 124, and a p-type semiconductor layer 126 sequentially grown on the buffer layer 110, for example, using a process such as metal organic chemical vapor deposition (MOCVD), hydride vapor phase epitaxy (HVPE), molecular beam epitaxy (MBE), or the like. In the stacked structure 120, positions of the n-type semiconductor layer 122 and the p-type semiconductor layer 126 may be reversed with respect to each other, and the p-type semiconductor layer 126 may first be formed on the buffer layer 110.

Figure 7A:
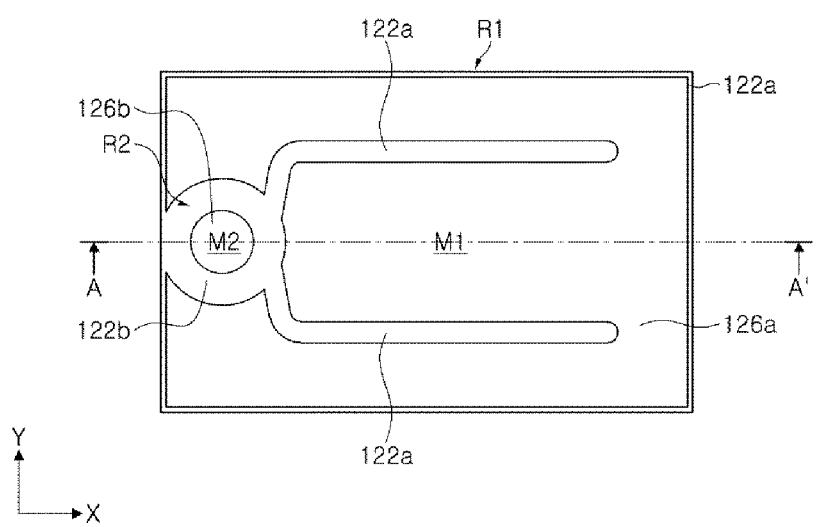
Figure 7B:
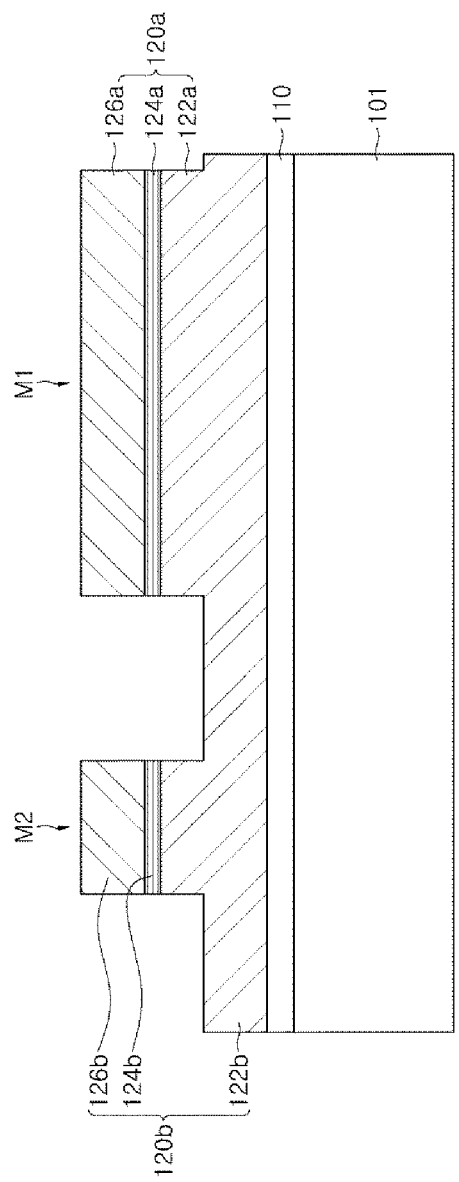

With reference to FIGS. 7A and 7B, portions of the n-type semiconductor layer 122, the active layer 124, and the p-type semiconductor layer 126 may be etched to expose at least a portion of the n-type semiconductor layer 122. Thus, the first and second structures 120a and 120b may be formed in the light emitting diode region R1 and the Zener diode region R2, respectively, and the first and second structures 120a and 120b may include non-etched regions such as first and second mesa-etched regions M1 and M2, respectively.

In the light emitting diode region R1, the first n-type semiconductor layer 122a may be exposed through an etching process in a region in which the first n electrode 150b (see FIG. 1) is to be formed, and in the Zener diode region R2, the second n-type semiconductor layer 122b may be exposed through the etching process in a region thereof including a region in which the second n electrode 140b (see FIG. 1) is to be formed.

A mask layer may be formed in a region excluding the region to which the first and second n-type semiconductor layers 122a and 122b are exposed through the etching process, and the first and second mesa-etched regions M1 and M2 may then be formed through wet or dry etching. According to one embodiment, the etching process may be performed such that the first and second n-type semiconductor layers 122a and 122b are not entirely etched through the vertical thickness of these layers, but only an upper surface thereof is partially etched.

Figure 8A:
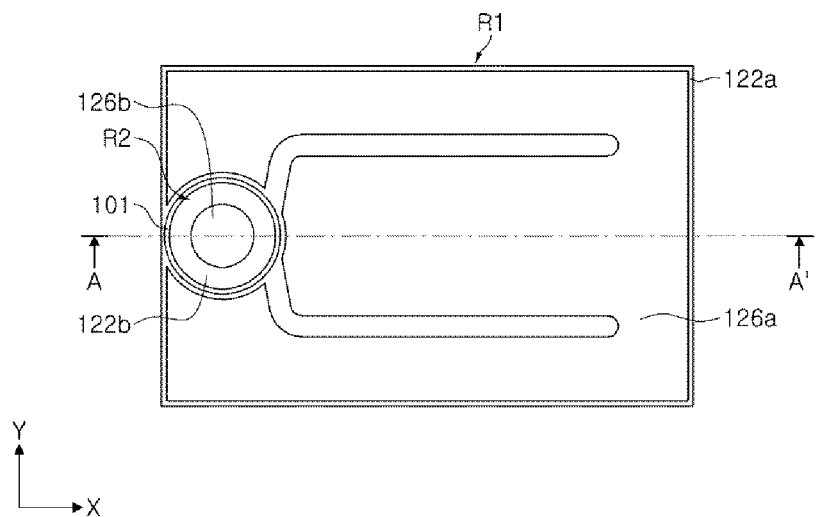
Figure 8B:
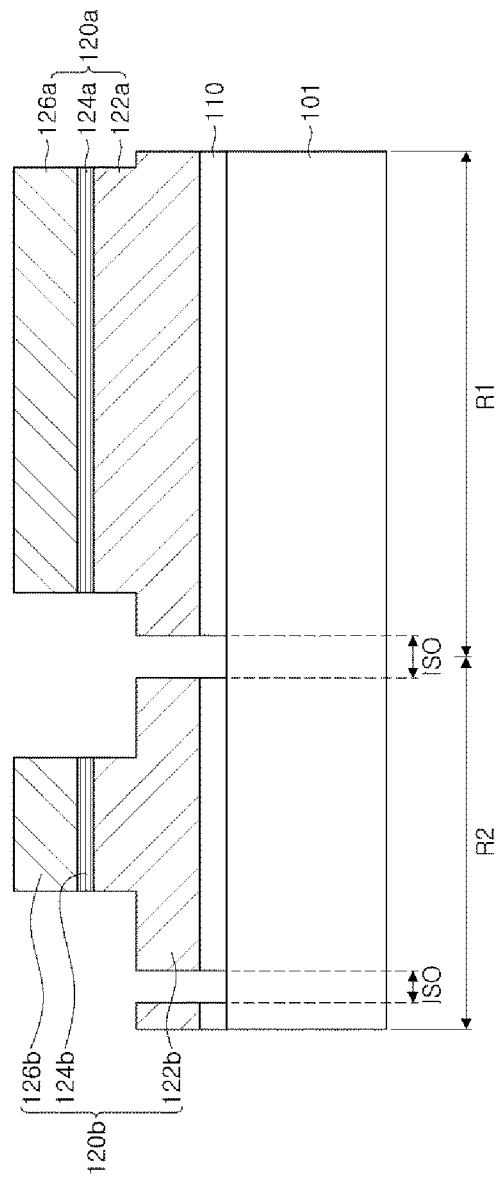

With reference to FIGS. 8A and 8B, in order to form the device isolation region ISO surrounding the Zener diode region R2, the first and second n-type semiconductor layers 122a and 122b and the buffer layer 110 may be partially removed. According to an embodiment, a portion of the substrate 101 may also be removed at the same time.

In one embodiment, the device isolation region ISO may have an enclosed band form, so as to surround the second mesa-etched region M2 therethrough, and the substrate 101 may be exposed in the device isolation region ISO. Accordingly, the Zener diode region R2 may be electrically isolated from the light emitting diode region R1. The device isolation region ISO may be formed to have a uniform width, but it is not limited thereto.

According to one embodiment, the device isolation region ISO extends from sides of the Zener diode region R2 not adjacent the light emitting diode region R1 to end portions of the semiconductor light emitting device. In addition, at this stage, the first and second n-type semiconductor layers 122a and 122b and the buffer layer 110 may be partially removed to expose the substrate 101 in edge regions of the semiconductor light emitting device.

Figure 9A:
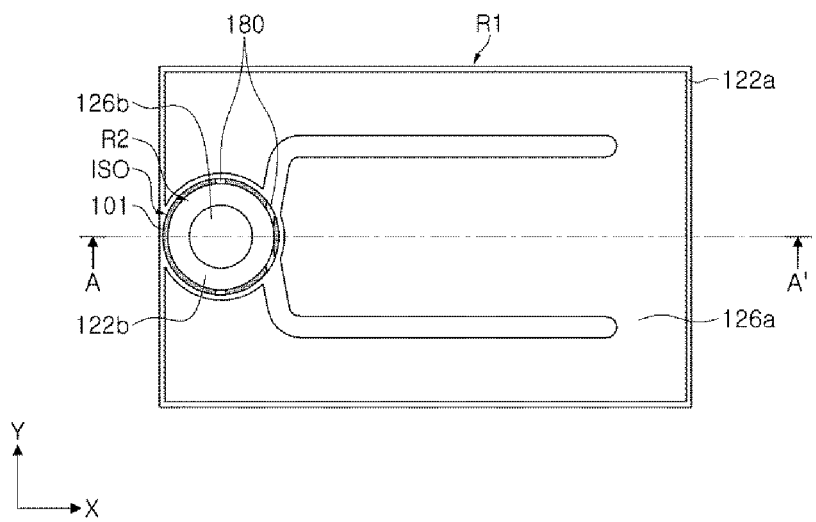
Figure 9B:
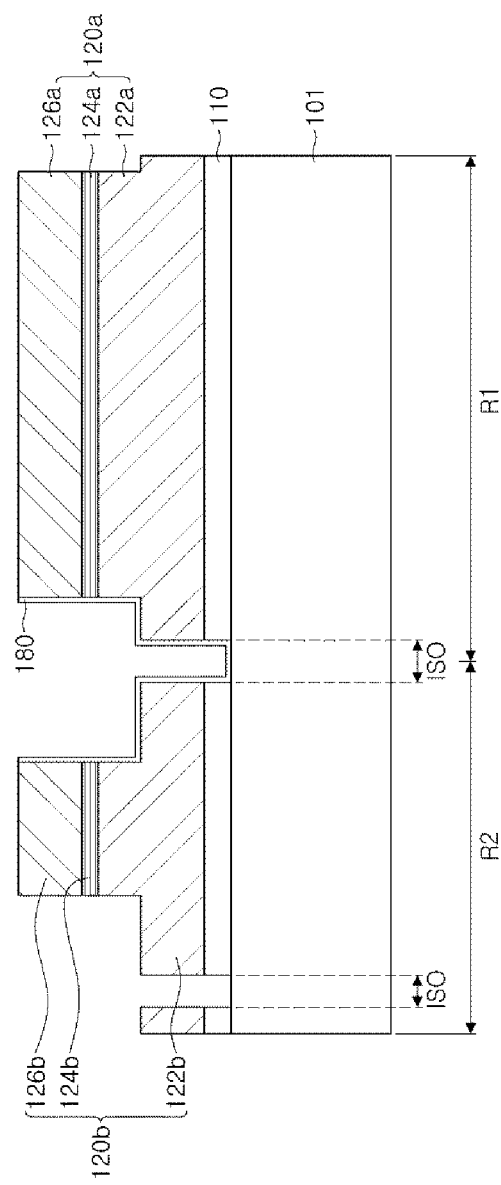

Referring to FIGS. 9A and 9B, an insulating layer 180 may be formed to cover portions of upper surfaces and lateral surfaces of the first structure 120a and the second structure 120b.

The insulating layer 180 may be a layer for insulating the connection electrode 145 (see FIG. 1) and the second p electrode 140a from the substrate 101 and the first and second structures 120a and 120b, and may be formed in a region in which the connection electrode 145 and the second p electrode 140a are disposed. The insulating layer 180 may be formed of, for example, a transparent insulating material such as silicon oxide, silicon nitride or the like.

According to an embodiment, the insulating layer 180 may also be formed to cover portions of upper surfaces and lateral surfaces of the first and second structures 120a and 120b in other regions. In this case, the insulating layer 180 may serve as a passivation layer protecting the first and second structures 120a and 120b and/or a current blocking layer below the first p electrode 150a (see FIG. 1). For example, the current blocking layer may be formed to have a predetermined size in a region corresponding to the pad portion 151 (see FIG. 1) of the first p electrode 150a.

Figure 10A:
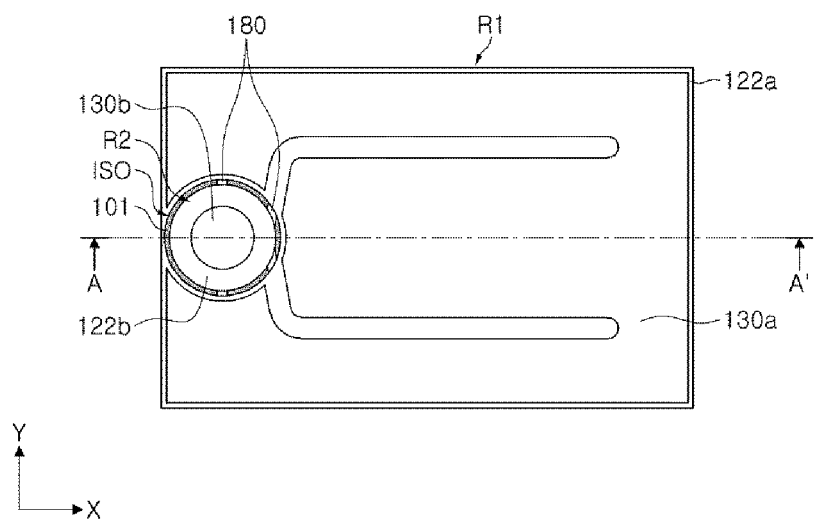
Figure 10B:
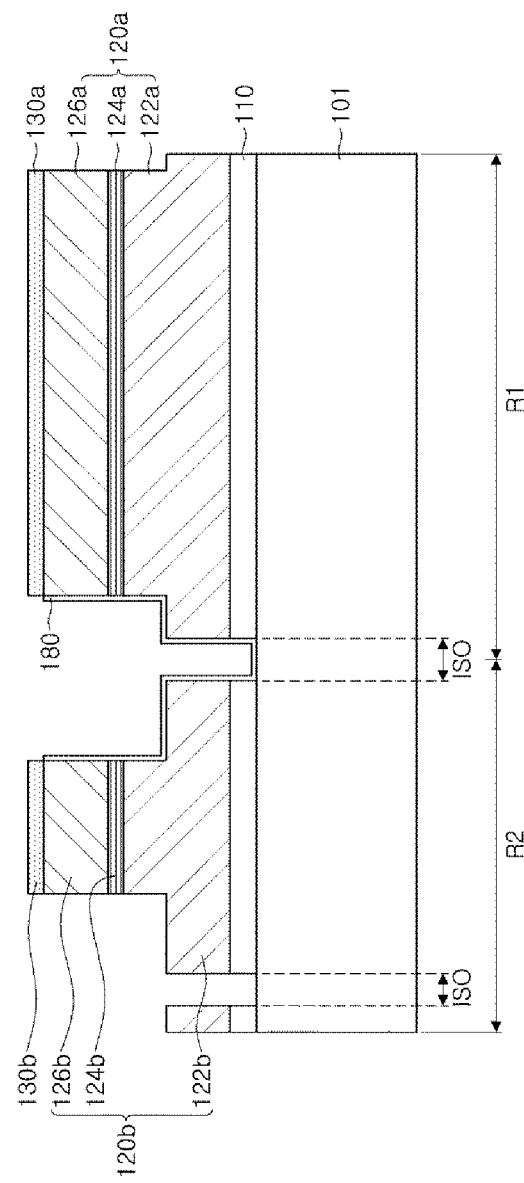

With reference to FIGS. 10A and 10B, transparent electrode layers 130a and 130b may be formed on the first and second p-type semiconductor layers 126a and 126b.

The transparent electrode layers 130a and 130b may be formed of a transparent conductive material as discussed above. According to one embodiment, the transparent electrode layers 130a and 130b may not be formed in at least a portion of a region in which the first p electrode 150a (see FIG. 1) is to be formed on the first p-type semiconductor layer 126a.

Then, with reference to FIGS. 1 and 2, the first and second n electrodes 150b and 140b, the first and second p electrodes 150a and 140a, and the connection electrode 145 may be formed on the first and second structures 120a and 120b. The first and second n electrodes 150b and 140b, the first and second p electrodes 150a and 140a, and the connection electrode 145 may be formed simultaneously or sequentially.

Figure 11:
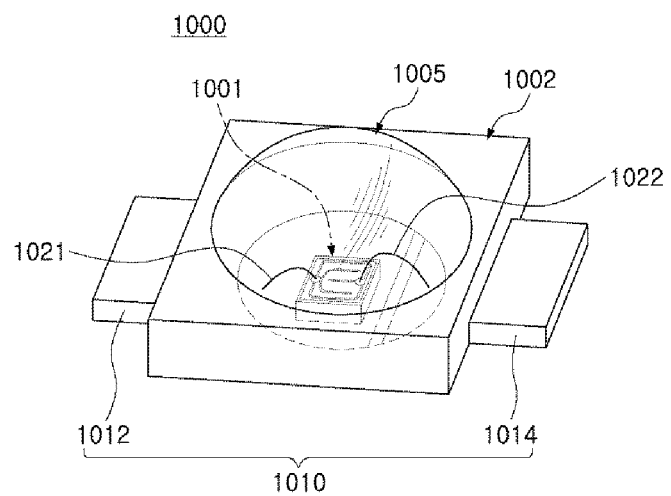
FIG. 11 is a perspective view illustrating an example in which a semiconductor light emitting device according to an embodiment of the present disclosure is applied to a package.

FIG. 11 is a perspective view illustrating an example in which a semiconductor light emitting device according to an embodiment of the present disclosure is applied to a package.

With reference to FIG. 11, a semiconductor light emitting device package 1000 includes a semiconductor light emitting device 1001, a package body 1002, and a pair of lead frames 1010. The semiconductor light emitting device 1001 may be mounted on the lead frame 1010 to be electrically connected to the lead frame 1010 through a first and second wire 1021 and 1022.

The lead frame 1010 may include a first and second lead frame 1012 and 1014. With further reference to FIG. 1, the first and second wires 1021 and 1022 may respectively connect the second p electrode 140a and the first p electrode 150a to the first and second lead frames 1012 and 1014.

According to one embodiment, a semiconductor light emitting device 1001 may also be mounted on other regions instead of the lead frame 1010, for example, on the package body 1002. In addition, package body 1002 may have a cup shape to improve light reflective efficiency. Such a reflective cup may be provided with an encapsulating portion 1005 formed of a transparent material to encapsulate the semiconductor light emitting device 1001, the first to second wire 1021 and 1022, and the like.

Figure 12:
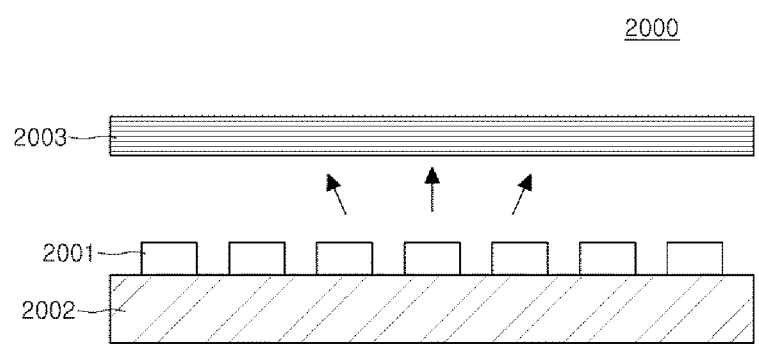
FIGS. 12 and 13 are cross-sectional views illustrating examples in which a semiconductor light emitting device according to an embodiment is applied to a backlight unit.
Figure 13:
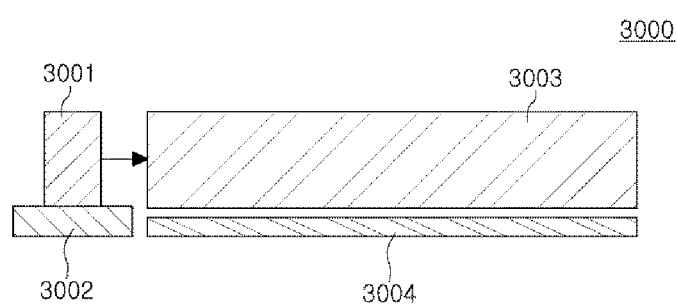

FIGS. 12 and 13 are cross-sectional views illustrating examples in which a semiconductor light emitting device according to an embodiment is applied to a backlight unit.

With reference to FIG. 12, a back light unit 2000 may include a light source 2001 mounted on a substrate 2002 and at least one optical sheet 2003 disposed thereabove. As the light source 2001, a light emitting device package having the above-described structure with reference to FIG. 11, or a structure similar thereto, may be used. In addition, the light source 2001 may be used by directly mounting a semiconductor light emitting device on the substrate 2002 (in a so-called chip on board (COB) mounting manner).

In the back light unit 2000 of FIG. 12, the light source 2001 emits light upwards in a direction in which a liquid crystal display device is disposed, while in a back light unit 3000 of another example illustrated in FIG. 13, a light source 3001 mounted on a substrate 3002 emits light in a lateral direction such that the emitted light may be incident onto a light guiding panel 3003 to be converted into a form of surface light source type light. Light, having passed through the light guiding panel 3003, may be discharged in an upward direction, and a reflective layer 3004 may be disposed below the light guiding panel 3003 to improve light extraction efficiency.

Figure 14:
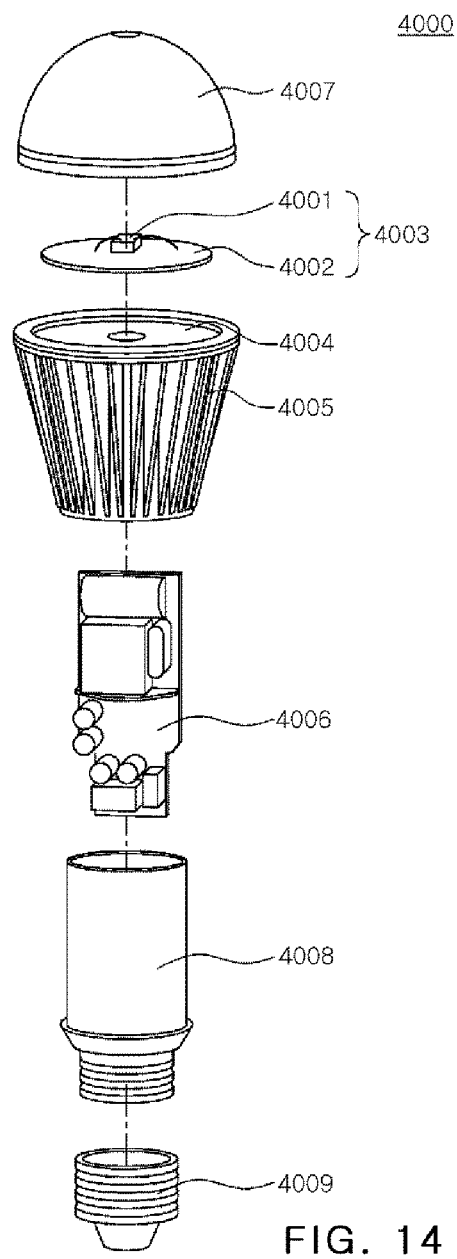
FIGS. 14 and 15 are exploded perspective views illustrating examples in which a semiconductor light emitting device according to an embodiment is applied to an illumination device.
Figure 15:
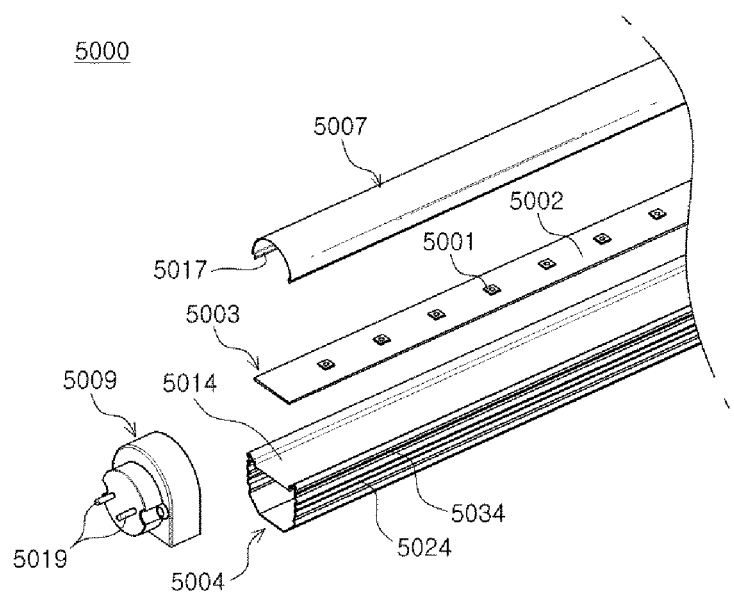

FIGS. 14 and 15 are exploded perspective views illustrating examples in which a semiconductor light emitting device according to one embodiment is applied to an illumination device.

With reference to FIG. 14, an illumination apparatus 4000 may be a bulb-type lamp and may include a light emitting module 4003, a driving unit 4006, and an external connection unit 4009. In addition, the illumination apparatus 4000 may further include an outer structure such as an external housing 4005, an internal housing 4008, and a cover unit 4007.

The light emitting module 4003 may include the semiconductor light emitting device 4001 having a structure the same as or similar to that of the semiconductor light emitting device 100 of FIGS. 1 to 4, and a circuit board 4002 having the semiconductor light emitting device 4001 mounted thereon. Although the present embodiment describes the case in which a single semiconductor light emitting device 4001 is mounted on the circuit board 4002, a plurality of semiconductor light emitting devices may be mounted thereon as needed. In addition, instead of directly mounting the semiconductor light emitting device 4001 on the circuit board 4002, the semiconductor light emitting device 4001 may be manufactured as a package type light emitting device and then mounted.

The external housing 4005 may serve as a heat radiating portion and may include a heat radiating plate 4004 directly contacting the light emitting module 4003 to improve heat radiation effect and heat radiating fins disposed to encompass a peripheral surface of the illumination apparatus 4000. The cover unit 4007 may be mounted on the light emitting module 4003 and have a convex lens shape. The driving unit 4006 may be installed in the internal housing 4008 to be connected to the external connection unit 4009 having a structure such as a socket structure to receive power from external power supplies. In addition, the driving unit 4006 may convert the received power into a current source suitable for driving a light source, for example, the semiconductor light emitting device 4001 of the light emitting module 4003, to then be supplied. For example, the driving unit 4006 may be configured of an AC-DC converter, a rectifying circuit component, or the like.

In addition, although not shown in FIG. 14, the illumination apparatus 4000 may further include a communications module.

With reference to FIG. 15, an illumination apparatus 5000 may be, for example, a bar-type lamp, and may include a light emitting module 5003, a body part 5004, a cover part 5007, and a terminal part 5009.

The light emitting module 5003 may include a substrate 5002 and a plurality of semiconductor light emitting devices 5001 installed on the substrate 5002. The semiconductor light emitting device 5001 may have a structure the same as or similar to that of the semiconductor light emitting device 100 of FIGS. 1 to 4.

The body part 5004 may have a recess 5014 in which the light emitting module 5003 is fixedly mounted on one surface thereof, and heat generated in the light emitting module 5003 may be externally discharged. Therefore, the body part 5004 may include a heat sink, a support structure, and a plurality of radiating fins 5024 protruding from both side surfaces thereof to radiate heat.

The cover part 5007 may be fastened to a holding groove 5034 of the body part 5004 and have a semicircular curved surface to irradiate light externally in a uniform manner. On a bottom surface of the cover part 5007, a protrusion 5017 may be formed in a length direction thereof to be engaged with the holding groove 5034 of the body part 5004.

The terminal part 5009 may be provided at least one open portion of both end portions of the body part 5004 in the length direction thereof to supply power to the light emitting module 5003, and may include an electrode pin 5019 protruding outwardly therefrom.

Figure 16:
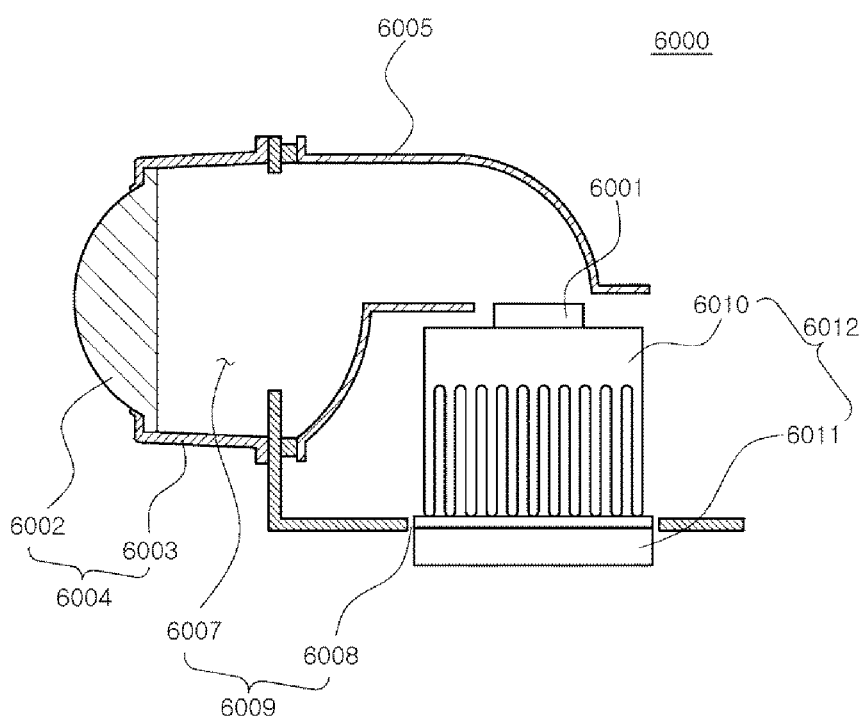
FIG. 16 illustrates an example in which a semiconductor light emitting device according to an embodiment is applied to a vehicle headlight.

FIG. 16 illustrates an example in which a semiconductor light emitting device according to an embodiment is applied to a vehicle headlight.

With reference to FIG. 16, a headlight 6000 for vehicle lighting or the like may include a light source 6001, a reflective unit 6005, and a lens cover unit 6004, and the lens cover unit 6004 may include a hollow guide 6003 and a lens 6002. The light source 6001 may include, for example, at least one among the semiconductor light emitting device packages of FIG. 11. In addition, the headlight 6000 may further include a heat radiating unit 6012 externally discharging heat generated in the light source 6001. The heat radiating unit 6012 may include a heat sink 6010 and a cooling fan 6011 to perform effective heat radiation. In addition, the headlight 6000 may further have a housing 6009 fixing and supporting the heat radiating unit 6012 and the reflective unit 6005, and the housing 6009 may include a central hole 6008 allowing the heat radiating unit 6012 to be coupled to one surface thereof. Further, the housing 6009 may include a front hole 6007 in the other surface integrally connected to the one surface to then be bent in a direction orthogonal thereto. The reflective unit 6005 may be fixed to the housing 6009 such that light generated in the light source 6001 may be reflected therefrom to be externally emitted through the front hole.

As shown in FIGS. 11-16, a variety of apparatuses can include the light emitting device described in FIGS. 1-5.

As set forth above, according to embodiments of the present disclosure, a semiconductor light emitting device having an improved withstand voltage against reverse ESD and an improved brightness by forming a Zener diode in an electrode of a semiconductor light emitting device, and a semiconductor light emitting apparatus including the same, are described.

While the present disclosure has been shown and described in connection with various embodiments, it will be apparent to those skilled in the art that modifications and variations could be made without departing from the spirit and scope of the present disclosure as defined by the appended claims.

What is claimed is:

1. A semiconductor light emitting device, comprising:
a substrate;
a first structure disposed on the substrate and including a first n-type semiconductor layer, a first active layer, and a first p-type semiconductor layer;
a second structure disposed on the substrate and spaced apart from the first structure and including a second n-type semiconductor layer, a second active layer and a second p-type semiconductor layer;
a first n electrode and a first p electrode connected to the first n-type semiconductor layer and the first p-type semiconductor layer, respectively; and
a second n electrode and a second p electrode connected to the second n-type semiconductor layer and the second p-type semiconductor layer, respectively,
wherein the first n electrode is extended to the second p electrode and the first n electrode and the second p electrode are formed of a single continuous material,
the second n electrode is spaced apart from the second active layer by a predetermined distance to encompass the second active layer,
the semiconductor light emitting device includes a light emitting diode region in which the first structure is formed and a Zener diode region in which the second structure is formed, and
the second structure includes a protruding portion in a central portion thereof and a step portion adjacent to the protruding portion, the protruding portion including the second n-type semiconductor layer, the second active layer, and the second p-type semiconductor layer all having sides that are coplanar with each other.

2. The semiconductor light emitting device of claim 1, wherein at least a portion of the second structure is disposed below at least part of the single continuous material that forms the first n electrode and the second p electrode.

3. The semiconductor light emitting device of claim 1, wherein the second active layer is disposed below at least part of the single continuous material that forms the first n electrode and the second p electrode.

4. The semiconductor light emitting device of claim 1, wherein the first p electrode is electrically connected to the second n electrode.

5. The semiconductor light emitting device of claim 4, further comprising a connection electrode electrically connecting the first p electrode and the second n electrode.

6. The semiconductor light emitting device of claim 5, wherein the connection electrode is spaced apart from the first and second structures by an insulating layer and extends along a lateral surface of the first structure.

7. The semiconductor light emitting device of claim 5, wherein the first p electrode includes a pad part and at least one finger part extended from the pad part, and the connection electrode is extended from the finger part.

8. The semiconductor light emitting device of claim 4, wherein the second p electrode includes a pad part and at least one finger part extended from the pad part, and the finger part is spaced apart from at least the second n type semiconductor layer by an insulating layer and extends to the first n electrode along a lateral surface of the second structure.

9. The semiconductor light emitting device of claim 1, wherein the second n electrode is spaced apart from the second active layer at a substantially uniform interval to encompass the second active layer.

10. The semiconductor light emitting device of claim 1, wherein the second n electrode has an open curved shape to encompass the second active layer.

11. The semiconductor light emitting device of claim 1, wherein the second n electrode is disposed on an upper surface of the step portion and covers a portion of an upper surface of the second structure on the step portion.

12. The semiconductor light emitting device of claim 1, wherein the substrate is exposed in at least one of the regions in which the first structure and the second structure are spaced apart.

13. The semiconductor light emitting device of claim 1, wherein:
the semiconductor light emitting device is located in a package body having a first electrode structure and a second electrode structure.

14. The semiconductor light emitting device of claim 13, wherein the first electrode structure includes conductive wires connected to the first n electrode and the second p electrode, and the second electrode structure includes a conductive wire connected to the first p electrode.

15. The semiconductor light emitting device of claim 1, wherein the second n electrode and the first p electrode are connected and conformally traverse, both laterally and vertically, along the first p-type semiconductor layer, first active layer, first n-type semiconductor layer, and second n-type semiconductor layer.

16. A semiconductor light emitting device, comprising:
a substrate;
a light emitting diode structure and a Zener diode structure spaced apart from each other on the substrate, each including a first semiconductor layer at a first vertical level, and a second semiconductor layer at a second vertical level below the first vertical level; and
a continuously formed electrode electrically connected to the first semiconductor layer of the light emitting diode structure and the second semiconductor layer of the Zener diode structure,
wherein the continuously formed electrode is electrically connected to the first semiconductor layer of the light emitting diode structure which has a first doping type and to the second semiconductor layer of the Zener diode structure which has a second doping type, the first doping type being opposite the second doping type.

17. The semiconductor light emitting device of claim 16, wherein:
at least a portion of the Zener diode structure is disposed below the continuously formed electrode, and at least a portion of the light emitting diode structure is disposed above the continuously formed electrode.

18. A semiconductor light emitting device, comprising:
a substrate;
a first structure disposed on the substrate and including a first n-type semiconductor layer, a first active layer, and a first p-type semiconductor layer;
a second structure disposed on the substrate and spaced apart from the first structure and including a second n-type semiconductor layer, a second active layer and a second p-type semiconductor layer;

a first n electrode and a first p electrode connected to the first n-type semiconductor layer and the first p-type semiconductor layer, respectively; and a second n electrode and a second p electrode connected to the second n-type semiconductor layer and the second p-type semiconductor layer, respectively, wherein the first n electrode is extended to the second p electrode and the first n electrode and the second p electrode are formed of a single continuous material, and the second n electrode is spaced apart from the second active layer by a predetermined distance to encompass the second active layer, wherein the second structure includes a protruding portion and a base portion in a central portion thereof and a step portion adjacent to the protruding portion, the protruding portion including the second n-type semiconductor layer, the second active layer, and the second p-type semiconductor layer all having side surfaces that are coplanar with each other.

* * * * *